United States Patent [19]
Forck et al.

[11] Patent Number: 5,986,871
[45] Date of Patent: *Nov. 16, 1999

[54] METHOD OF OPERATING A FUEL INJECTOR

[75] Inventors: Glen F. Forck; Umesh Shah, both of Peoria, Ill.

[73] Assignees: Caterpillar Inc., Peoria, Ill.; Lucas Industries Public Limited Company, Solihull, United Kingdom

[ * ] Notice: This patent issued on a continued prosecution application filed under 37 CFR 1.53(d), and is subject to the twenty year patent term provisions of 35 U.S.C. 154(a)(2).

[21] Appl. No.: 08/963,847

[22] Filed: Nov. 4, 1997

[51] Int. Cl.$^6$ .................................................. H01H 47/02
[52] U.S. Cl. ........................................ 361/160; 361/154
[58] Field of Search .................................... 361/152–156, 361/187, 159, 160, 170, 189, 190; 123/490, 472; 251/129.01, 129.15

[56] References Cited

U.S. PATENT DOCUMENTS

| | | | |
|---|---|---|---|
| 3,727,592 | 4/1973 | Wilkinson | 123/32 EA |
| 4,426,983 | 1/1984 | Seilly et al. | 123/506 |
| 4,452,210 | 6/1984 | Sasayama et al. | 123/490 |
| 4,523,569 | 6/1985 | Seilly et al. | 125/458 |
| 4,704,999 | 11/1987 | Hashikawa et al. | 123/299 |
| 4,779,596 | 10/1988 | Babitzka et al. | 123/472 |
| 4,782,803 | 11/1988 | Kikuchi | 123/300 |
| 4,966,119 | 10/1990 | Mitsuyasu et al. | 123/498 |
| 5,053,911 | 10/1991 | Kopec et al. | 361/154 |
| 5,070,836 | 12/1991 | Wahl et al. | 123/299 |
| 5,101,785 | 4/1992 | Ito | 123/357 |
| 5,128,825 | 7/1992 | Hurley et al. | 361/154 |
| 5,333,588 | 8/1994 | Cananagh | 123/506 |
| 5,402,760 | 4/1995 | Takeuchi et al. | 123/300 |
| 5,433,385 | 7/1995 | Sakagami et al. | 239/585.1 |
| 5,477,834 | 12/1995 | Yoshizu | 123/501 |
| 5,490,031 | 2/1996 | Braun et al. | 361/154 |
| 5,634,448 | 6/1997 | Shinogle et al. | 123/480 |
| 5,647,317 | 7/1997 | Weisman, II et al. | 123/299 |
| 5,784,245 | 7/1998 | Moraghan et al. | 361/154 |

FOREIGN PATENT DOCUMENTS 2330948A  5/1999  United Kingdom .

OTHER PUBLICATIONS

GB Search Report for GB application No. GB 9820429.0, dated Jan. 29, 1999.

*Primary Examiner*—Fritz Fleming
*Attorney, Agent, or Firm*—Marshall, O'Toole, Gerstein, Murray & Borun

[57] ABSTRACT

A method of operating a fuel injector comprises the steps of applying a test waveform to a solenoid coil of the injector to cause a response by an armature assembly and measuring the response of the armature assembly while the test waveform is applied to the solenoid coil. A control waveform for the injector is developed as a function of the variation of the measured response of the armature from a selected operational characteristic. The developed control waveform is thereafter applied to the solenoid coil to cause the armature assembly to approach a nominal position.

19 Claims, 5 Drawing Sheets

METHOD OF OPERATING A FUEL INJECTOR

TECHNICAL FIELD

The present invention relates generally to fuel injectors, and more particularly to a method of operating a fuel injector which may have characteristics that vary from nominal.

BACKGROUND ART

In an engine fuel system having a plurality of fuel injectors, it is typically desirable that all of the injectors have substantially identical injector operational characteristics. In the past, it was recognized that each injector should deliver approximately the same quantity of fuel and approximately the same timed relationship to the engine for proper operation. If the timing of the injectors diverged beyond acceptable limits, problems would be encountered due to the generation of different torques between cylinders. Further, knowledge that such variations in injector characteristics are inevitable require engine system designers to account for this variability. Accordingly, many engine systems are designed not for peak or maximum cylinder pressures or output, but rather, are designed to provide an output equal to the maximum theoretical output less an amount due to the worst case fuel injector variability.

One approach for solving these problems in unit injectors is the so-called select fit manufacturing process. Generally, a common procedure involves flowing fluid through each unit injector nozzle and pumping mechanism and categorizing each nozzle and pumping mechanism accordingly. During assembly, each nozzle is matched with pumping mechanisms known to be compatible, depending on the category under which the nozzle is categorized. The disadvantage associated with this approach is the relatively high cost involved with sorting the nozzles and pumping mechanisms and maintaining these groupings for the duration of the manufacturing and assembly process.

Another approach for solving these problems involves extremely rigid manufacturing procedures for achieving the high manufacturing precision necessary to meet the desired design specification. Such high manufacturing precision has the disadvantage of increasing the manufacturing costs, including the costs involved in manufacturing precision components and subassemblies and the cost related to the subsequent assembly process. Further, neither of the above mentioned manufacturing-oriented solutions satisfactorily controls rejection of completely assembled injectors that fail to fall within the timing and delivery tolerances of the design specification. Thus, excess scrap remains a problem with these manufacturing-oriented approaches.

With the advent of increasingly sophisticated electronic control a new approach to the problem of timing and delivery variations has emerged. In known electronic fuel injection systems, especially diesel-cycle internal combustion engine systems, the timing or start of injection, as well as the end of injection, are controlled by an electronic control, which controls these parameters for all of the engine cylinders.

An early attempt at using an electronic control to compensate for individual injector timing and delivery variation in an engine system involved measuring the flow characteristics of a particular injector at a single operating condition and comparing the flow characteristics to an ideal fuel injector. The results of this comparison were used to modify a nominal control signal to compensate for the measured variation. This approach has proven unsatisfactory because it does not take into account the fact that timing and delivery variations exist not only between injectors, but also as a function of the particular operating condition at which the injectors are operated. Thus, this approach has failed to provide a reduced injector to injector and injector-to-nominal performance variation necessary to meet today's increasingly strict emission standards.

Others have tried to compensate for variation in the start of injection characteristic of individual injectors in an engine system by designating a proxy for the timing or the start of injection characteristics of the injector. In general, these methods first electrically detect the closure of a valve controlling the start and duration of fuel injection in response to an injection command. These methods further assume that the time between valve closure and the start of injection is fixed. Given these two time intervals, the injection command can be modified to compensate for variation in the time between the injection command and valve closure. The problem that remains with this type of approach is that the detected valve closure does not precede the start of injection by a fixed time period. Thus, this approach does not eliminate injector-to-injector and injector-to-nominal variation due to variations of the valve closure to start of injection time interval.

Shinogle et al. U.S. Pat. No. 5,634,448 discloses a method and structure for controlling an apparatus, such as a fuel injector, using electronic trimming. The method includes the steps of measuring the resultant characteristics of the apparatus at a plurality of operating conditions, such as timing and delivery characteristics of a fuel injector, and adjusting a control signal as a function of the measured characteristics. This adjustment may be accomplished by adjusting base timing and duration of a fuel delivery command signal for the fuel injector. The fuel injector is thereafter controlled in accordance with the adjusted command signal to reduce performance variation. The method is implemented utilizing an electronic control module having a memory for storing trim signals for each injector which are used to effect the adjustment of the command signal.

SUMMARY OF THE INVENTION

A method of operating a fuel injector permits injector operation to be precisely controlled, thereby resulting in improved performance.

More particularly, according to one aspect of the present invention, a method of operating a fuel injector including a solenoid having a solenoid coil and an armature assembly moveable to a range of positions including a nominal position includes the steps of applying a test waveform to the solenoid coil to cause a response by the armature assembly and measuring the response of the armature assembly while the test waveform is applied to the solenoid coil. A control waveform is developed as a function of the variation of the measured response of the armature from a selected operational characteristic. The developed control waveform is thereafter applied to the solenoid coil to cause the armature assembly to approach the nominal position.

Preferably, the developed control waveform includes a pull-in current and a holding current wherein at least one of the pull-in and holding currents has a parameter determined in accordance with the variation of the position of the armature assembly from nominal position when the selected control waveform is applied to the solenoid coil.

Also preferably, the developed control waveform comprises an adjusted nominal control waveform. Still further, the step of measuring preferably comprises the step of detecting the position of the armature assembly. The step of selecting may further comprise the step of retrieving the control waveform from a memory as a function of variation of the detected position of the armature assembly from the nominal position.

The selected control waveform may include a pull-in current waveform portion and a holding current waveform portion each having a parameter determined in accordance with the variation of the position of the armature assembly from the nominal position when the selected control waveform is applied to the solenoid coil.

In accordance with an alternative aspect of the present invention, a method of operation a fuel injector including a solenoid having a solenoid coil and an armature assembly moveable to a nominal intermediate position when a nominal control waveform is applied to the solenoid coil includes the steps of applying the nominal control waveform to the solenoid coil to move the armature assembly and detecting movement of the armature assembly while the nominal control waveform is applied to the solenoid coil. The nominal control waveform is adjusted as a function of the detected movement of the armature and the adjusted nominal control waveform is thereafter applied to the solenoid coil to cause the armature assembly to approach the nominal intermediate position.

BEST MODE FOR CARRYING OUT THE INVENTION

Before proceeding to a description of the present invention, an exemplary environment for employing the invention will be described with reference to FIGS. 1–4.

Figure 1:
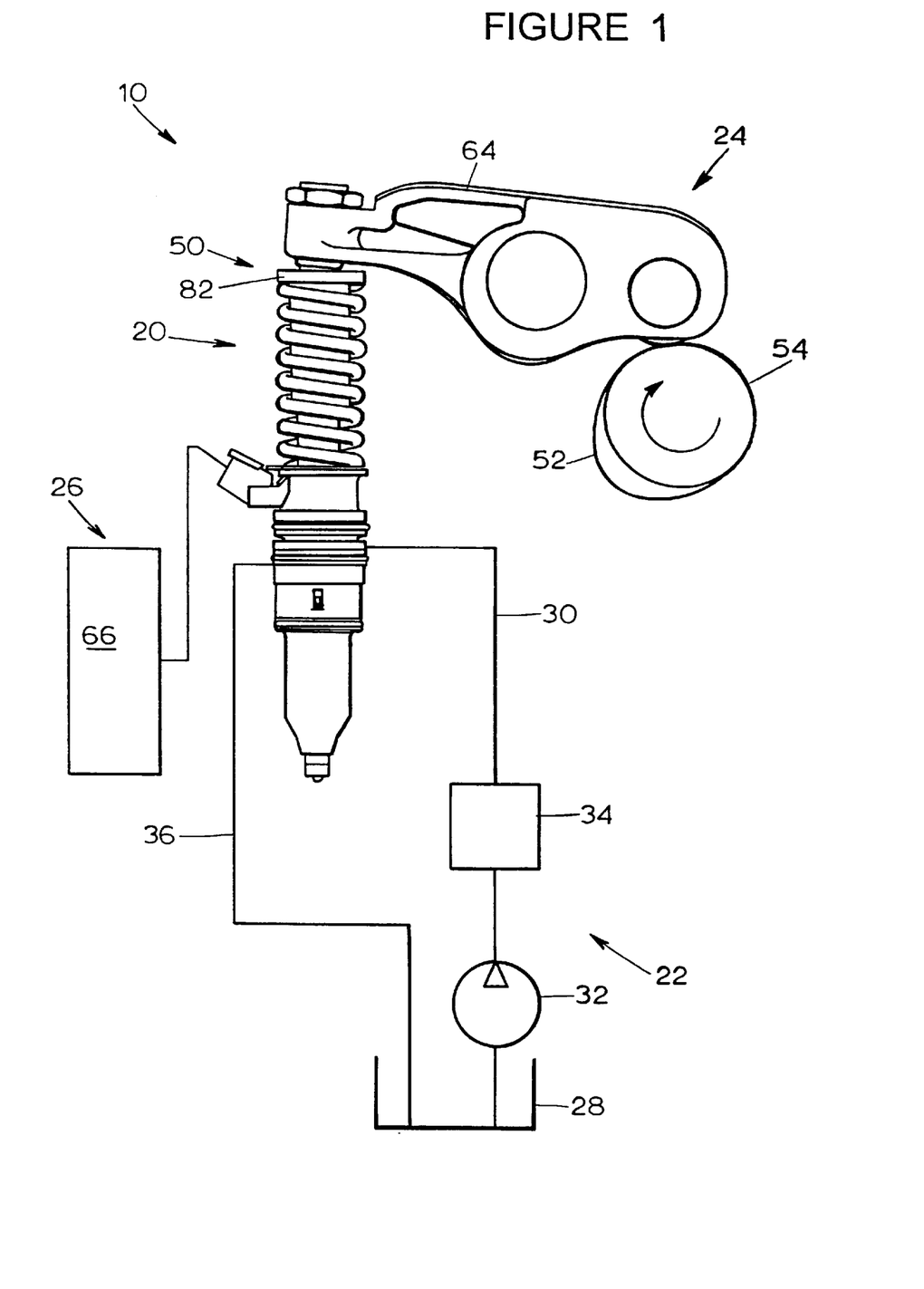
FIG. 1 is an elevational view of a fuel injector incorporating the present invention together with a cam shaft and rocker arm and further illustrating a block diagram of a transfer pump and a drive circuit for controlling the fuel injector.

Referring to FIG. 1, a portion of a fuel system 10 is shown adapted for a direct-injection diesel-cycle reciprocating internal combustion engine. However, it should be understood that the present invention is also applicable to other types of engines, such as rotary engines or modified-cycle engines, and that the engine may contain one or more engine combustion chambers or cylinders. The engine has at least one cylinder head wherein each cylinder head defines one or more separate injector bores, each of which receives an injector 20.

The fuel system 10 further includes apparatus 22 for supplying fuel to each injector 20, apparatus 24 for causing each injector 20 to pressurize fuel and apparatus 26 for electronically controlling each injector 20.

The fuel supplying apparatus 22 typically includes a fuel tank 28, a fuel supply passage 30 arranged in fluid communication between the fuel tank and the injector 20, a relatively low pressure fuel transfer pump 32, one or more fuel filters 34 and a fuel drain passage 36 arranged in fluid communication between the injector 20 and the fuel tank 28. If desired, fuel passages may be disposed in the head of the engine in fluid communication with the fuel injector 20 and one or both of the passages 30 and 36.

The apparatus 24 may be any mechanically actuated device or hydraulically actuated device. In the illustrated device a tappet and plunger assembly 50 associated with the injector 20 is mechanically actuated indirectly or directly by a cam lobe 52 of an engine-driven cam shaft 54. In a illustrated device, the cam lobe 52 drives a pivoting rocker arm assembly 64 which in turn reciprocates the tappet and plunger assembly 50. Alternatively, a push rod (not shown) may be positioned between the cam lobe 52 and the rocker arm assembly 64.

The electronic controlling apparatus 26 preferably includes an electronic control module (ECM) 66 which controls: (1) fuel injection timing and pressure; (2) total fuel injection quantity during an injection cycle; (3) the number of separate injection segments during each injection cycle; (4) the time interval(s) between the injection segments; and (5) the fuel quantity delivered during each injection segment of each injection cycle.

Preferably, each injector 20 is a unit injector which includes in a single housing apparatus for both pressurizing fuel to a high level (for example 207 MPa (30,000 p.s.i.)) and injecting the pressurized fuel into an associated cylinder. Although shown as a unitized injector 20, the injector could alternatively be of a modular construction wherein the fuel injection apparatus is separate from the fuel pressurization apparatus.

Figure 2:
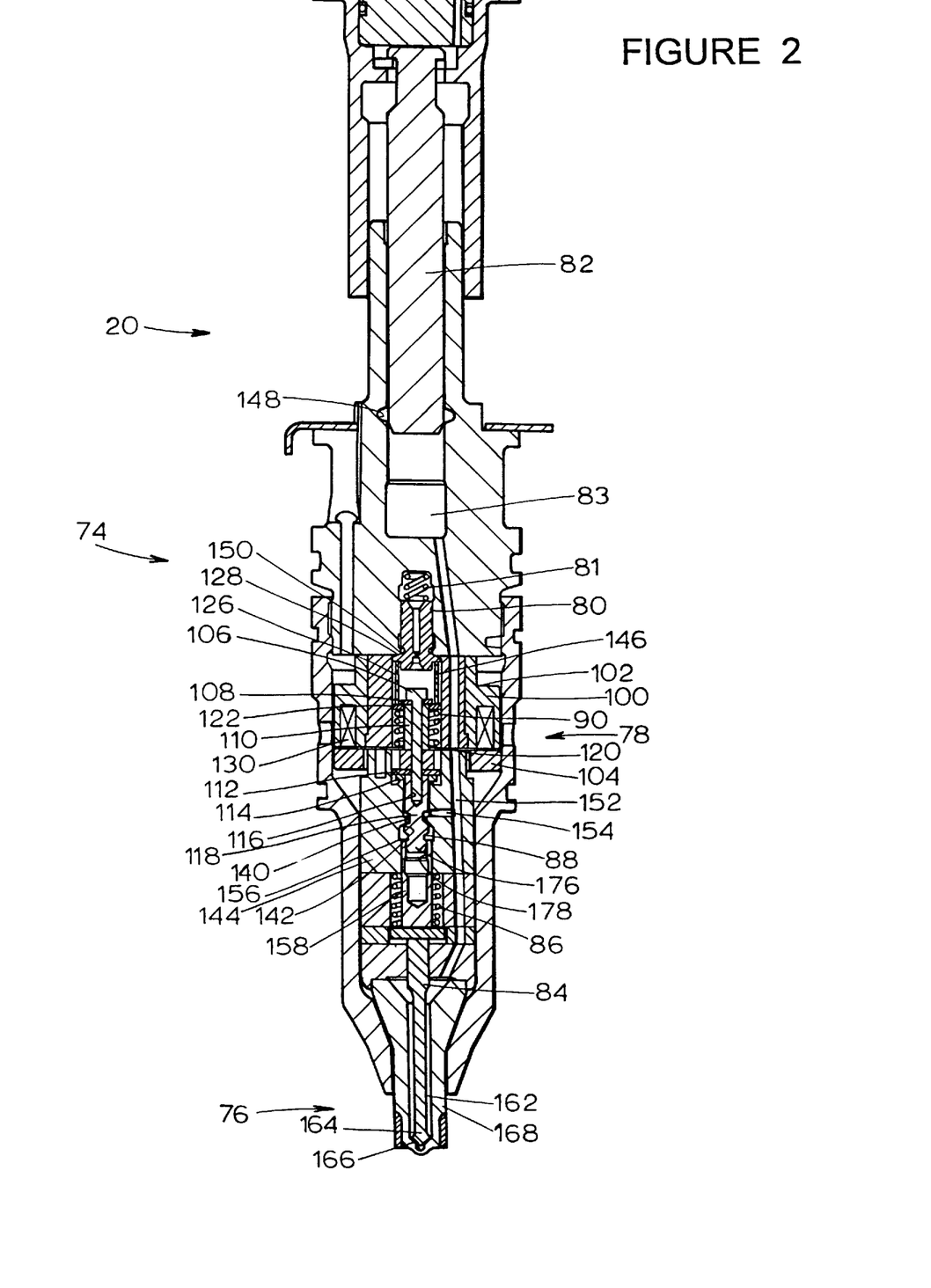
FIG. 2 is a fragmentary sectional view of the fuel injector of FIG. 1.
Figure 3:
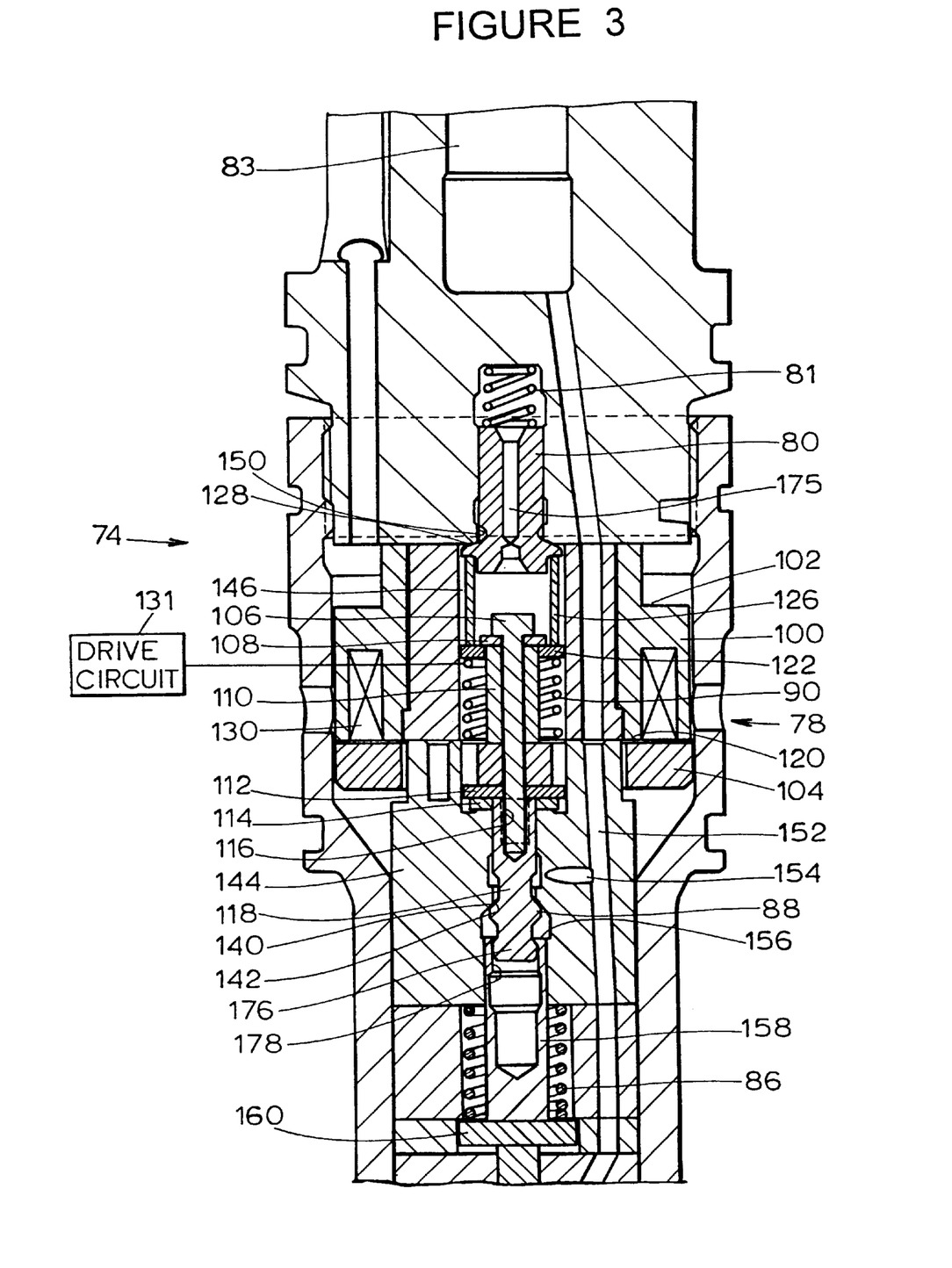
FIG. 3 is an enlarged, fragmentary sectional view of the fuel injector of FIG. 2 illustrating the solenoid in greater detail.

Referring now to FIGS. 2 and 3, the injector 20 includes a housing 74, a nozzle portion 76, an electrical actuator 78, a high pressure spill valve 80, a spill valve spring 81, a plunger 82 disposed in a plunger cavity 83, a check 84, a check spring 86, a two-way direct operated check (DOC) valve 88 and a DOC spring 90. The spill valve spring 81 exerts a first spring force when compressed whereas the DOC spring 90 exerts a second spring force greater than the first spring force when compressed.

The electrical actuator 78 comprises a solenoid 100 having a stator 102 and an armature assembly in the form of a single armature 104. A bolt 106 and a washer 108 bear against a cylindrical member 110 which in turn bear against the armature 104. The bolt 106 further extends through a pair of additional washers 112, 114 into a threaded bore 116 in a valve stem or poppet 118 of the DOC valve 88. (The washer 114 also surrounds the poppet 118.)

The DOC spring 90 is placed in compression between a surface 120 of the armature 104 and a DOC spring preload spacer 122 which abuts the washer 108. A cylindrical spill valve spacer 126 is disposed between the spacer 122 and a shouldered portion 128 of the spill valve 80. The DOC spring preload spacer 122 is axially slidable over the cylindrical member 110, for reasons explained hereinafter.

Prior to the time that injection is to occur, a solenoid coil 130 disposed in the solenoid stator 102 and coupled to a drive circuit 131 is unenergized. Accordingly, the armature 104 is not attracted to the solenoid stator 102, thereby permitting the spill valve spring 81 to open the spill valve 80. Fuel circulates from the transfer pump and the fuel supply passage 30 into internal passages (not shown) of the fuel injector 20 which connect with a space 146 below the shouldered portion 128. The fuel passes through the open spill valve 80 into a space 150 above the spill valve 80 and thence through one or more further passages (not shown) to the plunger cavity 83. When the plunger 82 is in the full upward position, passages (also not shown) in the plunger 82 conduct the fuel to an annular recess 148 surrounding the plunger 82, which is in turn coupled in fluid communication with the drain passage 36. The fuel thus recirculates through the injector 20 during non-injection portions of each engine cycle for the purpose of cooling and to fill the plunger chamber.

Also at this time, the DOC valve poppet 118 is disposed in an open position at which a sealing surface 140 of the valve poppet 118 is spaced from a valve seat 142 defined by a DOC body 144.

Figure 4:
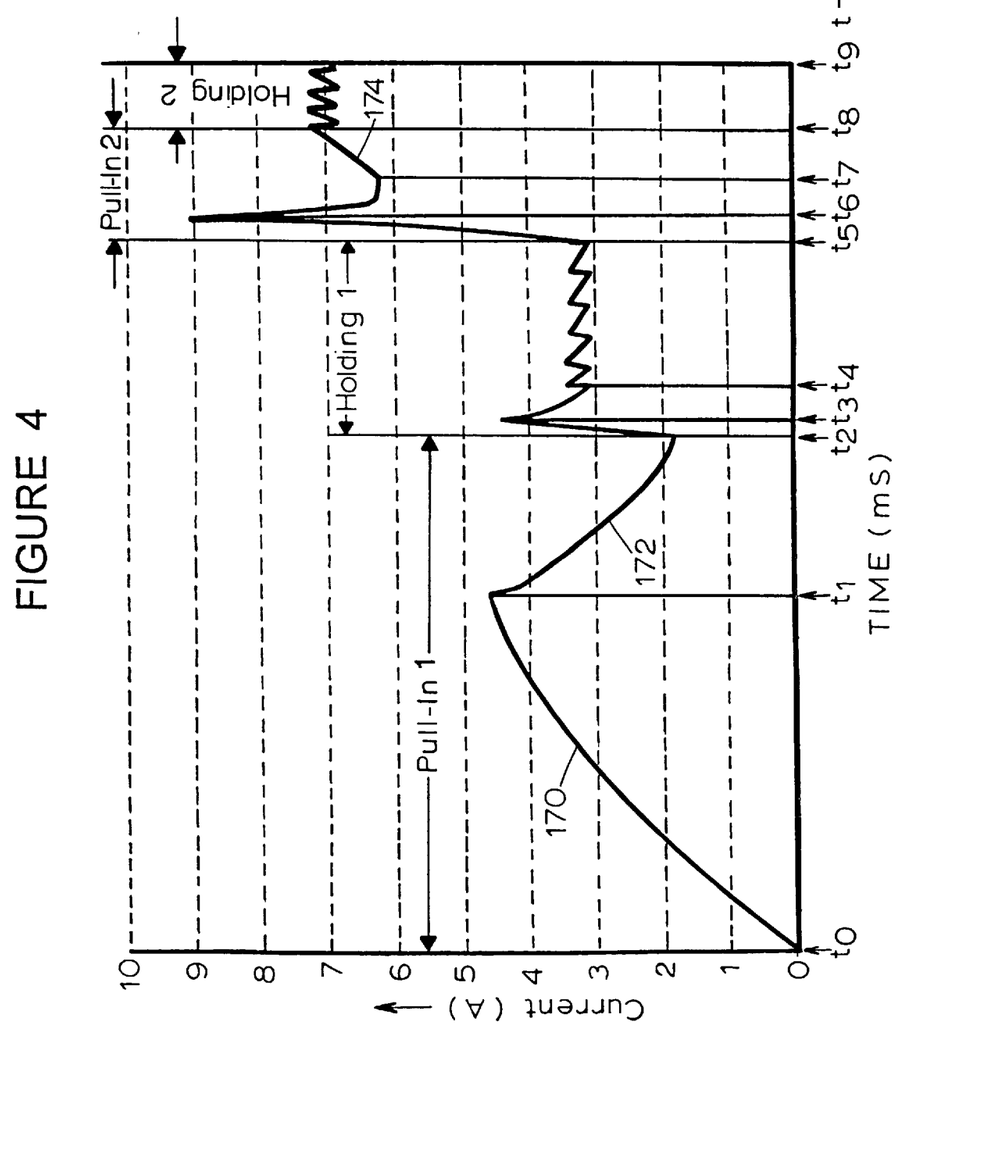
FIG. 4 is a waveform diagram illustrating current waveforms supplied to the solenoid coil of FIGS. 2 and 3.

FIG. 4 illustrates a nominal control current waveform 170 applied by the drive circuit 131 to the solenoid coil 130 during a portion of an injection sequence to accomplish fuel injection. The nominal control waveform includes a first waveform portion 172 extending between times $t=t_0$ and $t=t_5$ and a second waveform portion 174 occurring subsequent to the time $t=t_5$. Between time $t=t_0$ and time $t=t_2$, a first pull-in current is provided to the solenoid coil 130 to move the armature 104 a first distance toward the solenoid stator 102. A first holding current at somewhat reduced levels is thereafter applied between times $t=t_2$ and $t=t_5$. The magnitudes of the first pull-in current and the first holding current are selected so that the magnetic forces developed thereby on the armature 104 exceed the first spring force exerted by the spill valve spring 81 but are less than the second spring force exerted by the DOC valve spring 90. The motive force developed by the armature 104 is transmitted through the DOC spring 90, the DOC spring preload spacer 122 and the spill valve spacer 126 to close the spill valve 80. Movement of the spill valve 80 is damped by fluid flowing through a dampening orifice 175. The force developed by the armature 104 during this interval is insufficient to substantially compress the DOC spring 90. Further during this interval, the valve poppet 118 moves upwardly with the armature 104; however, the amount of this travel from the fully opened position of the valve poppet 118 is insufficient to cause the sealing surface 140 to contact the seat 142, and hence the DOC valve 88 remains open.

Subsequently, fuel is pressurized by downward movement of the plunger 82 in the plunger cavity 83. The pressurized fuel is conducted through a high pressure fuel passage 152 and a cross passage 154 past the sealing surface 140 and the seat 142 to an upper surface 156 of a DOC piston 158. The DOC piston 158 in turn bears against a spacer 160 which abuts a top end of the check 84. The fuel passage 152 further conducts pressurized fluid to a check passage 162. Accordingly, the fluid pressures across the check 84 are substantially balanced and hence the spring 86 moves the check to the closed position such that a check tip 164 bears against a seat 166 of a tip member 168.

Thereafter, subsequent to the time $t_5$, the second waveform portion 174 is applied to the solenoid coil 130. Following a second pull-in current magnitude, a second holding current is supplied to the coil 130. The second pull-in current and the second holding current are in general greater in magnitude than the first pull-in current and the first holding current, respectively. In response to application of this waveform portion, the armature 104 moves the valve poppet 118 against the force of the DOC spring 90, thereby causing the sealing surface 140 to contact the seat 142. During such movement, the cylindrical member 110 moves axially upward within the DOC spring preload spacer 122 so that an overtravel characteristic is obtained. Fluid captured in the space above the upper surface 156 of the DOC piston 158 bleeds via a controlled leakage path between a head portion 176 of the valve poppet 118 and a wall 178 of the DOC piston 158 and through a passage (not shown) extending through the side walls of the DOC piston 158 to drain. A low fluid pressure zone is thereby established above the DOC piston 158 thereby causing the check 84 to move upwardly and initiate fuel injection. It should be noted that this controlled leakage path is sufficiently small to maintain a high fluid pressure condition when the DOC valve 88 is open but is large enough to quickly bleed off the high pressure fluid when the DOC valve 88 is closed.

When injection is to be terminated, the current supplied to the solenoid 130 may be reduced to the holding level of the waveform portion 172 as illustrated in FIG. 4. If desired, the current delivered to the solenoid coil 130 may instead be reduced to zero or any other level less than the first holding level. In any case, the magnetic attractive force on the armature 104 is thus reduced, permitting the DOC spring 90 initially to move the valve poppet 118 downwardly to the open position whereby fluid communication is again established between the fuel passage 152 and the space above the upper surface 156 of the DOC piston 158. The application of high fuel pressure to the top of the DOC piston 158 and the force exerted by the spring 86 cause the check 84 to move downwardly such that the check tip 164 engages the seat 166, thereby preventing further fuel injection. Subsequently, the current supplied to the solenoid coil 130 may be reduced to zero or any other level less than the first holding level (if it has not already been so reduced). Regardless of whether the applied current level is immediately dropped to the first holding level or to a level less than the first holding level, the spill valve spring 81 opens the spill valve 80 after the DOC spring 90 moves the valve poppet 118 downwardly. Fuel then circulates through the spill valve 80, the spaces 146 and 150, the plunger cavity 83, the passages in the plunger 82 and the annular recess 148 to drain for cooling purposes as described above.

Still further, multiple or split injections per injection cycle can be accomplished by supplying suitable waveform portions to the solenoid coil 130. For example, the first and second waveform portions 172, 174 may be supplied to the coil 130 to accomplish a pilot or first injection. Immediately thereafter, the current may be reduced to the first holding current level and then increased again to the second pull-in and second holding levels to accomplish a second or main injection. Alternatively, the pilot and main injections may be accomplished by initially applying the waveform portions 172 and 174 to the solenoid coil 130 and then repeating application of the portions 172 and 174 to the coil 130. The durations of the pilot and main injections (and hence, the quantity of fuel delivered during each injection) are determined by the durations of the second holding levels in the waveform portions 174. Of course, the waveform shapes shown in FIG. 4 may be otherwise varied as necessary or desirable to obtain a suitable injection response or other characteristic.

As should be evident from the foregoing, the drive circuit 131 is capable of moving the armature 104 to a first (or intermediate) position and a second position as a result of the application of first and second waveform portions, respectively, to the solenoid coil 130. Movement to the first position closes the spill valve 80 whereas movement to the second position closes the DOC valve 88.

The electromagnetic force exerted by the solenoid coil 106 increases as the air gap length of the solenoid 100 is reduced. Variability in the air gap length due to assembly tolerances causes a force variability from solenoid-to-solenoid even if current is carefully controlled. This variability can be accommodated by selecting a spill valve spring 81 and a DOC spring 90 and supplying electric current levels to the solenoid coil 106 which are large enough to work for all cases. However, this method leads to higher spring loads and electrical currents then would otherwise be needed if no variability existed in the solenoid characteristics.

Industrial Applicability

Figure 5:
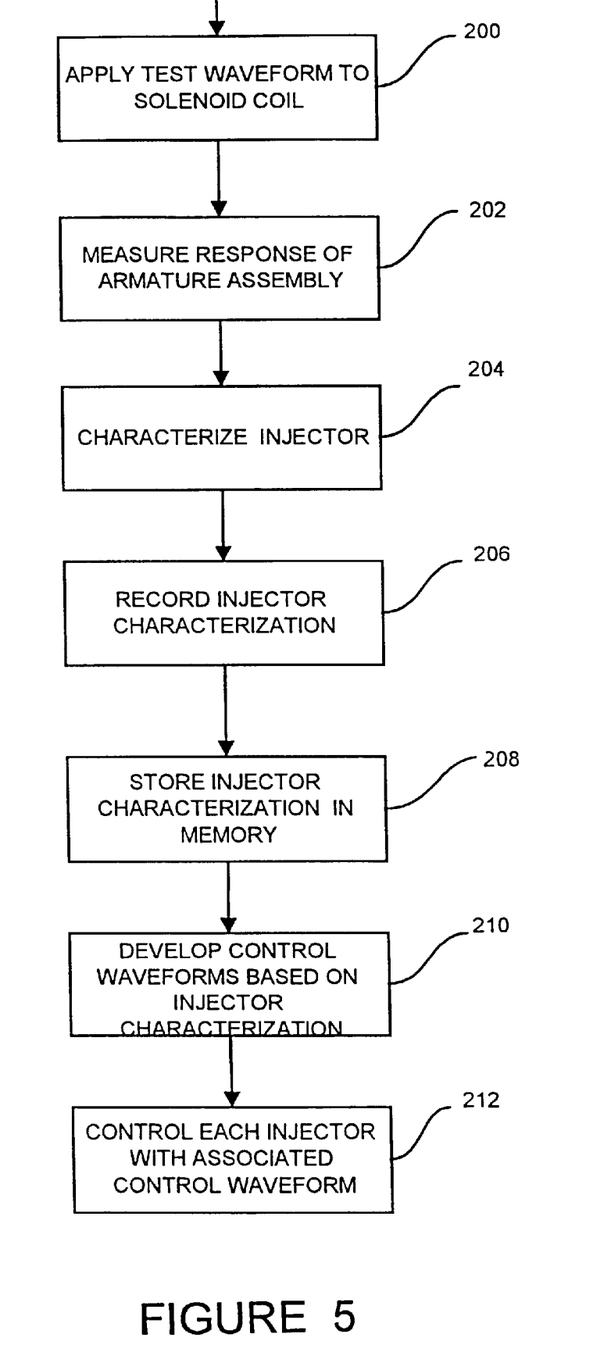
FIG. 5 is a flow chart illustrating the method of the present invention.

FIG. 5 illustrates the steps of the method of the present invention. As should be evident from the foregoing discussion, a primary goal is to move the armature 104 to the first (or intermediate) position but not beyond when the first waveform portion 172 is applied to the solenoid coil 130. According to one aspect of the present invention, the present invention adjusts the waveform applied to the solenoid coil 130 so that the armature 104 is moved to the intermediate position without overshoot.

The method of FIG. 5 begins at a block 200 wherein a fuel injector is mounted on a test stand and a test waveform is applied to the solenoid coil 130. This test waveform may be a nominal waveform identical to one or both of the waveform portions 172 and/or 174 or any other suitable waveform. The next step in the method is to measure the response of the armature assembly (block 202). For example, the fuel injector may be coupled to a fluid supply source and the current waveform portion 172 may be applied to the solenoid coil 130. The time at which fuel pressurization begins (i.e., the point at which the high pressure spill valve 80 closes) may be detected. This detection may be effected by applying a force to the plunger 82 while the test waveform is applied to the solenoid coil 130 and detecting the time at which back pressure is initially developed. This, in turn, requires the use of a force sensor to detect the back pressure or apparatus to detect fluid pressure in the injector. Alternatively, any other fuel injector condition could be detected by suitable apparatus, such as actual armature position. In any event, the next step (block 204) is to characterize the injector based on the measurement of the preceding step. Generally, the injector control waveform has one or more parameters that could be trimmed. For example, these parameters may include the magnitude of the first holding current to minimize the current levels and the required spring preloads to allow the injector to work even with variability in the production process and current control. The timing of the beginning ($t_0$) of the waveform 170 can be adjusted to trim the time at which pressurization begins to account for injector build variability. In addition, the duration between $t_0$ and $t_1$, can be adjusted so that the energy delivered to the solenoid coil is sufficient to move the armature to the intermediate position but not beyond. Still further, the duration of a period between times $t_0$ and $t_{10}$ during which the current in the solenoid coil is forced to decay at other than an exponential rate can be adjusted. This, in turn, can be used to coarsely trim the energy delivered to the solenoid coil so that adequate energy is supplied to start armature motion, but not so much as to cause overshoot when the intermediate position is reached. The times $t_5$–$t_8$ can also be adjusted to accomplish pilot injection. Any other parameters (i.e., magnitude and/or duration) could be adjusted, for example, the time between $t_0$ and the beginning of actual fuel injection or the pull-in current magnitude could be varied. Once the desired time adjustments to the parameter(s) of the injector control waveform for the particular injector have been determined, the step of characterizing the injector is complete and control passes to a block 206.

In the next step (block 206), the trim category into which each injector has been characterized may be optionally recorded. This recordation may be on the injector itself, for example, in the form of a number stamped on the injector and/or a bar code, or the like. Any other form of recordation may alternatively or in addition be used. The characterizations of the injectors used in a particular engine are then stored in a memory in the ECM 66 (block 208). This may be accomplished by reading the injector characterization and manually inputting the information into the memory or by automatically entering the information through the use of a bar code reader, etc. This reading and entry may occur at or following assembly of the injector into the engine or at any other time.

The remaining steps of the method of the present invention take place during operation of the injectors. At a block 210, control waveforms for the injectors based on the entered injector characterizations are developed. Specifically, in a first embodiment, one or more look-up tables which store values of each adjustable parameter of the control waveform are addressed using each characterization and the retrieved values are used by the ECM 66 to develop appropriate control waveforms. In an alternative embodiment, trim values for modifying a nominal control waveform to have appropriate magnitudes of pull-in and current holding levels and durations are stored in the memory together with the nominal control waveform. The nominal control waveform is thereafter adjusted using the trim values. In either event, a control waveform is developed for each injector and the control waveforms are used to control the associated injectors during subsequent operation (block 212).

The present invention is not limited to trimming of the current waveform 172. In fact, any magnitude and/or duration of any portion of either current waveform portion 172 and/or 174 or any other portion of waveforms applied to the fuel injectors may be trimmed in accordance with the particular injector operating characteristics. Thus, for example, where split injection is to be accomplished, one or more of the pull-in or holding levels of the pilot or main injection portions may be varied as needed according to the injector response to an applied test waveform. In this case, the injector response may be measured as the time between application of a pull-in current level and the time at which the injector begins injecting fluid in response to application of such pull-in current.

Numerous modifications and alternative embodiments of the present invention will be apparent to those skilled in the art in view of the foregoing description. Accordingly, this description is to be construed as illustrative only and is for the purpose of teaching those skilled in the art the best mode of carrying out the invention. The details of the structure and/or function may be varied substantially without departing from the spirit of the invention, and the exclusive use of all modifications which come within the scope of the appended claims is reserved.

We claim:

1. A method of operating a fuel injector to achieve a predetermined desired operational characteristic, the fuel injector including a spill valve, a direct operated check (DOC) valve, and a solenoid having a solenoid coil and an armature assembly movable through a range of positions including a first position to close the spill valve to cause fuel pressurization and a second position to close the DOC valve to cause fuel injection, the method comprising the steps of:

determining a variation of a measured fuel pressurization characteristic of the fuel injector from a predetermined desired fuel pressurization characteristic by: (a) applying a test waveform to the solenoid coil to cause a movement by the armature assembly to the first position; (b) detecting the movement of the armature assembly while the test waveform is applied to the solenoid coil to determine the measured fuel pressurization characteristic of the fuel injector; and (c) determining the variation between the measured fuel pressurization characteristic and the predetermined desired fuel pressurization characteristic;

developing a control waveform as a function of the variation between the measured fuel pressurization characteristic and the predetermined desired fuel pressurization characteristic; and thereafter applying the developed control waveform to the solenoid coil to cause the armature assembly to approach the first position to close the spill valve such that the fuel injector achieves the predetermined desired fuel pressurization characteristic.

2. The method of claim 1, wherein the developed control waveform includes a holding current determined in accordance with the variation of the measured fuel pressurization characteristic of the fuel injector from the predetermined desired fuel pressurization characteristic when the test waveform is applied to the solenoid coil.

3. The method of claim 1, wherein the developed control waveform includes a pull-in current determined in accordance with the variation of the measured fuel pressurization characteristic of the fuel injector from the predetermined desired fuel pressurization characteristic when the test waveform is applied to the solenoid coil.

4. The method of claim 3, wherein the step of developing comprises the step of adjusting a time period between an initial point of the control waveform and a maximum pull-in current magnitude.

5. The method of claim 1, wherein the step of developing comprises the step of adjusting an initial point of the control waveform.

6. The method of claim 5, wherein the step of applying further comprises the step of retrieving a nominal control waveform and at least one trim value from a memory to recreate the control waveform for the fuel injector.

7. The method of claim 5, wherein the step of applying further comprises the step of retrieving a plurality of adjustable parameters from a memory based on a characterization of the fuel injector to recreate the control waveform for the fuel injector.

8. The method of claim 1, wherein the developed control waveform includes a pull-in current waveform portion and a holding current waveform portion each having a parameter determined in accordance with the variation of the measured fuel pressurization characteristic of the fuel injector from the predetermined desired fuel pressurization characteristic when the test waveform is applied to the solenoid coil.

9. The method of claim 8, wherein the step of developing comprises the step of adjusting a time period during which the control waveform decays at other than an exponential rate.

10. The method of claim 9, wherein the step of developing includes the step of adjusting one or more parameters of a pilot injection portion of the control waveform.

11. The method of claim 1, wherein the fuel injector is one of a plurality of fuel injectors operating in an engine, and the fuel injector is the only member of the plurality to which the developed control waveform is applied.

12. A method of operating a fuel injector to compensate for individual characteristics thereof, the fuel injector including a spill valve, a direct operated check (DOC) valve, and a solenoid having a solenoid coil and an armature assembly movable to a first position to cause fuel pressurization and a second position to cause fuel injection when a nominal control waveform is applied to the solenoid coil, the method comprising the steps of:

applying the nominal control waveform to the solenoid coil to move the armature assembly to the first position;

detecting the movement of the armature assembly while the nominal control waveform is applied to the solenoid coil to determine a measured fuel pressurization characteristic of the fuel injector;

developing an adjusted control waveform as a function of a variation of the measured fuel pressurization characteristic from a desired fuel pressurization characteristic; and after inserting the fuel injector into an engine, applying the adjusted control waveform to the solenoid coil to cause the armature assembly to approach the first position to produce the desired fuel pressurization characteristic.

13. The method of claim 12, wherein the step of developing includes the step of varying a holding current magnitude.

14. The method of claim 11, wherein the step of developing comprises the step of varying at least one of a pull-in current waveform portion and a holding current waveform portion.

15. The method of claim 11, wherein the step of developing comprises the step of adjusting an initial point of the adjusted control waveform.

16. The method of claim 15, wherein the step of developing comprises the step of adjusting a time period between the initial point of the adjusted control waveform and a maximum pull-in current magnitude.

17. The method of claim 12, wherein the step of developing comprises the step of adjusting a time period during which the adjusted control waveform decays at other than an exponential rate.

18. The method of claim 12, wherein the step of developing comprises the step of adjusting one or more parameters of a pilot injection portion of the adjusted control waveform.

19. The method of claim 12, wherein the fuel injector is one of a plurality of fuel injectors operating in the engine, and the fuel injector is the only member of the plurality to which the adjusted control waveform is applied.

\* \* \* \* \*